(12) United States Patent
Eckert et al.

(10) Patent No.: US 11,563,286 B2
(45) Date of Patent: Jan. 24, 2023

(54) LIGHTING DEVICE WITH PLUG CONNECTION FOR ELECTRICAL CONNECTION OF TWO CIRCUIT BOARDS

(71) Applicant: LEDVANCE GmbH, Garching bei Munich (DE)

(72) Inventors: Klaus Eckert, Herbrechtingen (DE); Markus Hofmann, Bad Abbach (DE); Thomas Klafta, Burglengenfeld (DE); Andreas Lovich, Augsburg (DE); Henrike Streppel, Regensburg (DE); Steffen Tegethoff, Pentling (DE); Marcel Vuc, Ingolstadt (DE)

(73) Assignee: LEDVANCE GMBH, Garching bei Munich (DE)

( * ) Notice: Subject to any disclaimer, the term of this patent is extended or adjusted under 35 U.S.C. 154(b) by 232 days.

(21) Appl. No.: 16/256,454

(22) Filed: Jan. 24, 2019

(65) Prior Publication Data
US 2019/0229451 A1 Jul. 25, 2019

(30) Foreign Application Priority Data
Jan. 24, 2018 (DE) .......................... 102018101599.2

(51) Int. Cl.
*H01R 12/73* (2011.01)
*H01R 12/72* (2011.01)

(52) U.S. Cl.
CPC ........... *H01R 12/73* (2013.01); *H01R 12/721* (2013.01)

(58) Field of Classification Search
CPC .... H01R 12/73; H01R 12/721; H01R 4/4809; H01R 12/52; H01R 12/57; F21V 23/006; F21V 7/043; F21V 3/02; F21K 9/23; H05K 1/00
USPC .......................................................... 439/65
See application file for complete search history.

(56) References Cited

U.S. PATENT DOCUMENTS

| | | | |
|---|---|---|---|
| 6,812,718 B1 * | 11/2004 | Chong | G01R 1/07342 324/754.07 |
| 8,992,051 B2 * | 3/2015 | Yang | F21V 3/02 362/294 |
| 9,890,942 B2 * | 2/2018 | Lin | F21V 23/006 |
| 9,951,910 B2 * | 4/2018 | Reier | F21K 9/23 |
| 9,995,441 B2 * | 6/2018 | Power | F21V 7/043 |
| 2012/0230034 A1 | 9/2012 | Boomgaarden et al. | |

FOREIGN PATENT DOCUMENTS

| | | |
|---|---|---|
| CN | 201029132 Y | 2/2008 |
| CN | 201263246 Y | 6/2009 |
| CN | 203218526 U | 9/2013 |

(Continued)

*Primary Examiner* — Jean F Duverne
(74) *Attorney, Agent, or Firm* — Hayes Soloway PC

(57) ABSTRACT

A lighting device contains a first circuit board and a second circuit board. The first circuit board has one or more connecting sections having overall at least two contact areas. The second circuit board has an opening through which the connecting section of the first circuit board can extend. At least two contact elements, which are electrically connected to conductive tracks of the second circuit board, are arranged on the second circuit board. Each contact element has a contact region by which the contact element butts against one of the contact areas of the first circuit board. As a result, an electrical connection is produced between the two circuit boards.

20 Claims, 3 Drawing Sheets

(56) References Cited

FOREIGN PATENT DOCUMENTS

| | | |
|---|---|---|
| CN | 203549729 U | 4/2014 |
| CN | 204005395 U | 12/2014 |
| CN | 104716486 A | 6/2015 |
| CN | 204986913 U | 1/2016 |
| CN | 205065628 U | 3/2016 |
| CN | 205245085 U | 5/2016 |
| CN | 205447323 U | 8/2016 |
| DE | 102013214236 A1 | 1/2015 |
| DE | 102014222512 A1 | 5/2016 |

\* cited by examiner

LIGHTING DEVICE WITH PLUG CONNECTION FOR ELECTRICAL CONNECTION OF TWO CIRCUIT BOARDS

CROSS-REFERENCE TO RELATED APPLICATIONS AND PRIORITY

This patent application claims priority from German Patent Application No. 102018101599.2 filed Jan. 24, 2018, which is herein incorporated by reference in its entirety.

TECHNICAL FIELD

The present invention relates to an electrical connection of two circuit boards, in particular for a light fixture.

BACKGROUND

In LED light fixtures, two circuit boards (printed circuit boards) are often used: the LED (light-emitting diode) is, in particular, arranged on a first circuit board; and the components of an electronic driver, which provides the electrical energy necessary for operation of the LED with the required parameters (current, voltage), are arranged on another circuit board. The separation into two circuit boards is necessary for reasons of space, particularly in retrofit lamps, which serve for replacement of conventional filament or gas discharge lamps, the housing shape is predetermined.

It is known to solder the two circuit boards to one another, which is difficult because of the high thermal conductivity of the circuit boards. It is likewise known to provide one of the circuit boards with a plug into which the other circuit board can be inserted.

In known designs the two electrical connections (+ and −) are often made by means of separate connections. This increases the space required for connection of the two circuit boards.

SUMMARY

Starting from the known prior art, it is an object of the present invention to provide a lighting device with an improved connection of two circuit boards.

The object is achieved by a lighting device with the features of the independent claims. Advantageous further embodiments are set out in the subordinate claims.

Accordingly, a lighting device is proposed which has a first circuit board and a second circuit board. In particular, one or more LEDs can be mounted on one of the circuit boards (light engine). In particular, one or more electronic components which are necessary for the operation of the LEDs can be mounted on the other one of the circuit boards (driver). The first circuit board has one or more connecting sections having overall at least two contact areas. For example, a connecting section having at least two contact areas or two connecting sections each having at least one contact area can be provided. The contact areas can be, for example, parts of conductive tracks.

At least two contact elements, which are electrically conductively connected to conductive tracks of the second circuit board, are arranged on the second circuit board. Each contact element has a contact region where the contact element butts against one of the contact areas of the first circuit board. As a result, if the two circuit boards are fitted together as provided, an electrically conductive connection between the circuit boards is produced by means of the contact areas and the contact elements. Subsequent soldering of the two circuit boards to one another is not necessary. As a result, the assembly of the lighting device is easy to automate.

The two circuit boards are shaped so that the arrangement of the two assembled circuit boards can be installed in a housing.

In an embodiment, the second circuit board has an opening which is configured to receive the connecting section of the first circuit board. The first circuit board and the second circuit board are arranged so that the connecting section of the first circuit board extends through the opening of the second circuit board. As a result, an improved stability of the assembled circuit boards can be achieved.

In an embodiment, the at least two contact areas are arranged on opposite surfaces of the first circuit board. As a result, a good separation of the two contact areas can be achieved. If a minimum spacing must be maintained between the two contact areas, which in operation carry different electrical potentials, this arrangement is advantageous, since the effective spacing between the two contact areas corresponds to at least double the spacing of a contact area from the edge of the connecting section (plus the thickness of the circuit board).

In an embodiment, the at least two contact elements are arranged on opposite sides of the opening. As a result, a minimum spacing between the two contact elements can be simply maintained.

In an embodiment, the first circuit board is located substantially on a first side of the second circuit board. The contact elements are arranged on a second side of the second circuit board, i.e. on the opposite side.

In other words, substantially only the connecting section of the first circuit board is inserted through the opening in the second circuit board so far that the contact areas on the connecting section are located on the other side of the second circuit board than the rest of the first circuit board. The contact areas can then be contacted by the contact elements located on this side of the first circuit board. This arrangement can improve the mechanical stability of the assembled circuit board, since the first circuit board or the connecting section thereof can be retained mechanically by the contact element and can be guided through the opening.

In addition to the connecting section, the first circuit board can also have one or more retaining sections which likewise extend through further openings in the second circuit board and as a result serve to improve the mechanical stability. Such retaining sections, which in particular extend from a first side of the second circuit board beyond the second side of the second circuit board, can also come into engagement with other components of the light fixture in order to achieve improved retention of the first circuit board or the two assembled circuit boards.

In an embodiment the contact elements are elastic. This simplifies the positioning of the contact elements on the second circuit board. They do not have to be mounted with a precisely dimensioned spacing but can initially be mounted so that the spacing between them is somewhat smaller than the thickness of the first circuit board, so that the contact elements can be bent apart as the two circuit boards are fitted together.

In an embodiment, the contact elements butts against the contact areas with pressure (press fit). This ensures a reliable electrical connection between the contact elements and the contact areas and thus between the two circuit boards.

In an embodiment at least one of the contact elements has a strip of an electrically conductive, preferably metallic material (for example copper alloys such as CuSn6 (copper with 6% tin)). The material can preferably be soldered and has spring characteristics.

The contact element preferably consists only of a strip of a metallic material, that is to say in particular it has no further elements which, for example as the main body of a plug or of a socket, retain the contact element. In particular, the contact element can be bent out of a strip of a metallic material. This allows a very simple and cost-effective production of the contact element, for example by punching a strip out of a metal plate and subsequent bending of the strip into the required shape.

In an embodiment, the contact element has a fastening region by which the contact element is electrically conductively connected to a conductive track of the second circuit board. In particular, if the contact element—as described above—consists of a strip of a metallic material, the fastening region can be a section of the strip.

In an embodiment, the fastening region and the contact region are arranged at an angle relative to one another. In particular, if the contact element—as described above—consists of a strip of a metallic material, an angle between the fastening region and the contact region allows a simple adaptation of the contact element to the respectively present arrangement of the contact areas relative to the second circuit board. The pressure with which the contact region butts against the contact area can also be set simply by the angled arrangement.

The contact element can consist, in particular, of a strip of a metallic material which has only two substantially flat sections as a fastening region and a contact region, which are arranged at an angle relative to one another. Such a contact element can be produced particularly simply and cost-effectively.

A contact element bent out of a strip of a metallic material can also have further structures. For example, the end of the contact region by which the contact element butts against the contact area of the first circuit board can be bent, so that the contact element does not butt against the contact area of the first circuit board with an edge of the metal strip, but with the bend. As a result, the risk of damage to the contact area during fitting together of the circuit boards can be reduced. A retaining region can also be provided, which at the free end of the fastening region extends at an angle (for example a right angle) thereto. Such a holding region can simplify the fitting of the contact element onto the circuit board.

In an embodiment, the contact elements are electrically conductively connected by soldering to conductive tracks of the second circuit board. This simplifies the production of the light fixture, since in a production step the contact elements together with the other components on the second circuit board (for example LED) can be fastened on the second circuit board. Alternatively, the contact elements can also be electrically conductively connected by means of an electrically conductive adhesive to conductive tracks of the second circuit board.

The contact elements can also be connected to the circuit board by riveting, crimping, screws and, for example, also bent retaining lugs.

BRIEF DESCRIPTION OF THE DRAWINGS

Preferred further embodiments are explained in greater detail by the following description of the drawings. In the drawings.

DETAILED DESCRIPTION OF THE DRAWINGS

Figure 1:
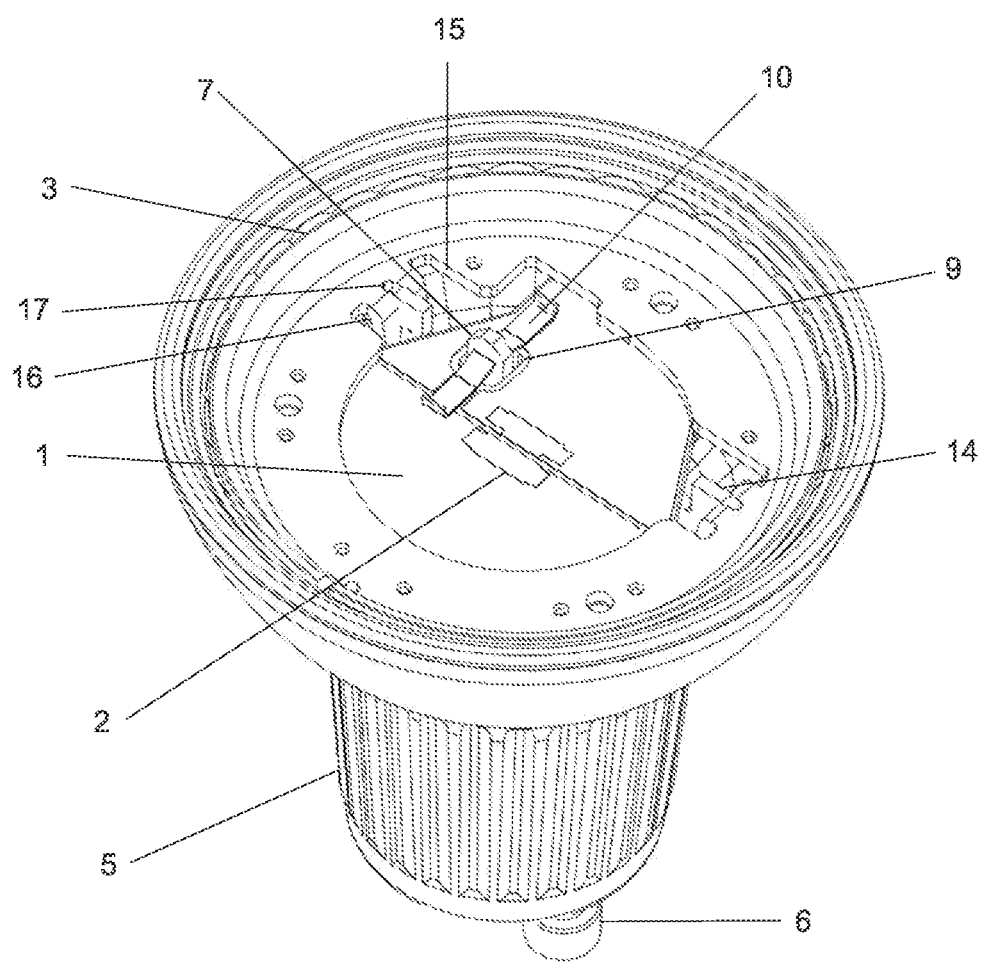
FIG. 1 shows a schematic representation of an embodiment of a light fixture.

Preferred exemplary embodiments are described below with reference to the drawings. In this case elements which are the same, similar, or act in the same way are provided with identical reference numerals in the different drawings, and repeated description of some of these elements is omitted in order to avoid redundancies.

Figure 2:
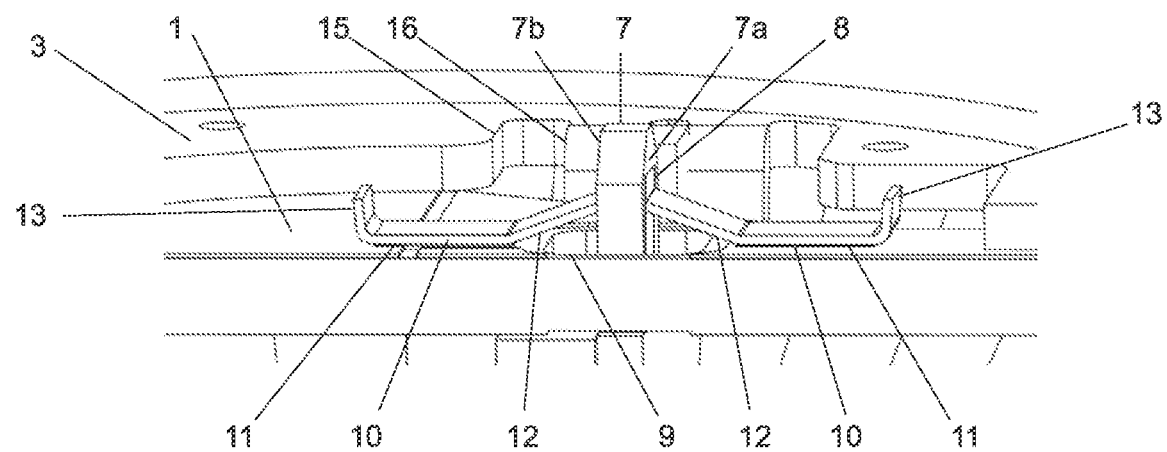
FIG. 2 shows a schematic representation of a detail of the connection of two circuit boards in an embodiment of a light fixture.

An embodiment of a light fixture according to the invention is illustrated schematically in FIGS. 1 and 2. The light fixture is designed as a LED retrofit lamp in a reflector model (for example in the model MR16 with a base GU10), but other models are also possible. The light fixture has a light engine (LE) which has at least one LE circuit board 1 (second circuit board) with at least one LED. In this and the following drawings the LED is not illustrated, but only the solder pads 2, onto which a LED module (i.e. an electronic component which contains one or more LEDs) can be fastened, for example soldered. The side of the LE circuit board 1 on which the LED is mounted is designated below as the upper side.

The LE circuit board 1 can be designed, for example, as a metal core circuit board in order for the heat generated by the LED in operation to be diverted quickly to the outside. At the edge of the LE circuit board 1 the circuit board is in thermal contact with a cooling element 3 in order to further improve the heat dissipation. The LE circuit board 1 can be connected to the cooling element 3 by a heat-conducting adhesive or a heat-conducting adhesive strip. Alternatively or in addition, the LE circuit board 1 can be connected to the cooling element 3 mechanically, for example by screwing or staking.

Furthermore, the light fixture has a driver board 4 (first circuit board) which is arranged below the LE circuit board 1 in the housing 5 of the light fixture. The driver board 4 contains the electronic components of the driver which generates the parameters (current, voltage) necessary for the LED from the energy provided by means of the connectors 6 (for example pins).

On its edge facing the LE circuit board 1 the driver board 4 has a connecting section 7 as well as two retaining sections 14. It is also possible for a different number of retaining sections 14 to be provided, for example no, one, three or more retaining sections.

The connecting section 7 has on each of its two surfaces 7a, 7b a contact area 8 in the form of a piece of a conductive track. The two contact areas 8 constitute the driver outputs (for example + and −). Accordingly, they are electrically connected to the driver and provide the energy supply for the LED. The connecting section 7 extends through an opening 9 in the LE circuit board 1, so that the two contact areas 8 can be contacted by contact elements 10 which are arranged on the upper side of the LE circuit board 1.

On the upper side of the LE circuit board 1 the contact elements 10 are electrically conductively connected to conductive tracks (not shown) and on both sides of the opening 9 are in each case arranged adjacent to the two surfaces 7a, 7b of the connecting section 7.

Each contact element 10 consists of a strip of a metal plate (for example CuSn6) which is subdivided in three areas by being bent twice. In other embodiments of the contact element the strip can also be bent once, three times or more often. The middle region constitutes a fastening region 11 by which the contact element 10 is connected to a conductive track, for example by soldering.

Figure 4:
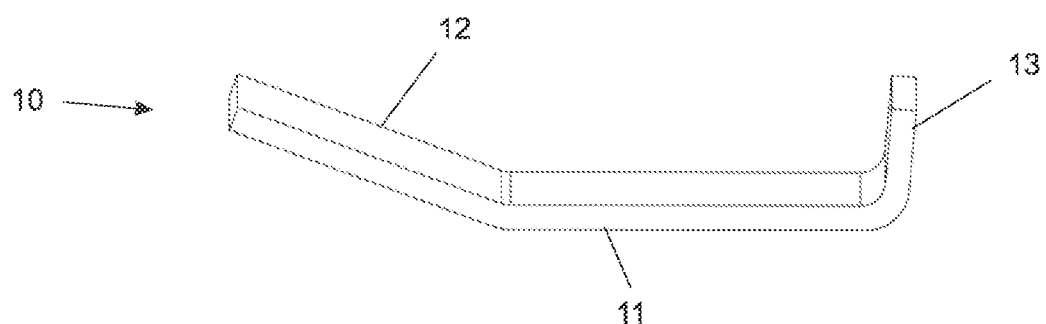
FIG. 4 shows a schematic representation of an embodiment of a contact element.

As shown in FIG. 4, contact region 12, which encloses an angle of approximately 20° to approximately 25° with the fastening region 11 extended, adjoins the fastening region 11 on one side. The angle can also be smaller (for example approximately 5°) or larger (for example approximately 45°, 75° or 90°). The fastening region and the contact region can also merge into one another without an angle. The free end of the contact region 12 butts with pressure against the contact area 8 on the respective surface 7a, 7b of the connecting section 7. As a result, an electrical connection between the driver board 4 and the LE circuit board 1 is produced.

A retaining region 13, which encloses an angle of approximately 90° to approximately 100° with the fastening region 11, adjoins the fastening region 11 on the other side. This retaining region 13 facilitates the receiving and placing of the contact element 10 in the assembly of the light fixture. In other embodiments of the contact element no retaining region is provided.

An embodiment of such a contact element 10 is illustrated schematically in FIG. 4.

In an embodiment of a contact element according to FIG. 4 the width of the strip is approximately 1.8 mm and the thickness of the strip is approximately 0.2 mm. The length of the fastening region 11 is approximately 3.25 mm on the underside and approximately 2.9 mm on the upper side. The length of the contact region 12 is approximately 2.3 mm. The length of the retaining region 13 is approximately 1.0 mm (measured from the underside of the fastening region 11 to the end of the retaining region 13). The angle between the fastening region 11 and the contact region 12 is approximately 160°. The angle between the fastening region 11 and the contact region 13 is approximately 95°.

Figure 3:
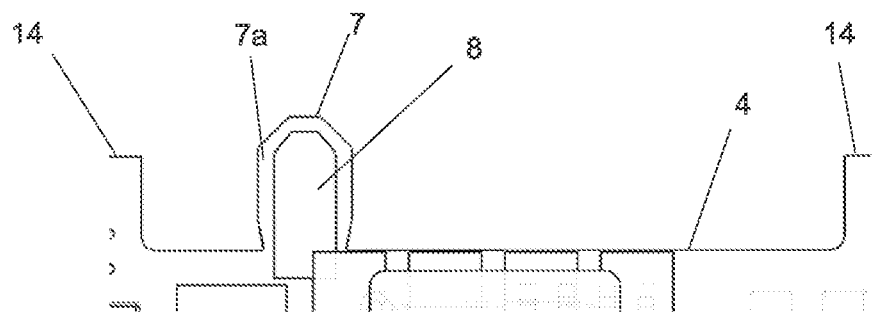
FIG. 3 shows a schematic partial representation of a circuit board of an embodiment of a light fixture.

A detail of a driver board 4 of a light fixture 3 according to the invention is shown schematically in FIG. 3. This shows the connecting section 7 at the upper edge of the driver board 4 with a contact area 8 arranged thereon. The upper end of the connecting section 7 is designed with chamfered corners. This facilitates the introduction of the connecting section 7 into the opening 9 of the LE circuit board 1.

The contact area can also be roller-shaped or barrel-shaped.

In addition to the connecting section 7, the driver board 4 also has on its upper margin two retaining sections 14 which, like the connecting section 7, are configured as projections of the driver board 4. In other embodiments the driver board has no retaining section or differently configured retaining sections. The retaining sections 14 project, when the connecting section 7 of the driver board 4 has been inserted through the opening 9 in the LE circuit board 1 and the contact elements 10 contact the contact area 8, i.e. in the assembled state of the two circuit boards 1, 4, beyond the surface of the LE circuit board 1, preferably like the connecting section 7. In this case, the length of the retaining sections 14 can be greater than, smaller than or the same as the length of the connecting section 7.

Cutouts 15 are provided in the LE-circuit board 1 at the locations at which the driver board 4 has the retaining sections 14. Retainers 16, which are formed as part of the cooling element 3, project into these cutouts 15. Each retainer 16 has a slot 17, of which the width corresponds to the thickness of the retaining sections 14 of the driver board 4. In FIGS. 1 and 2 the retainers 16 are illustrated as downwardly angled tabs into which the driver board 4 is pressed during assembly. However, the retainers can also lie in the plane of the cooling element. During the fitting together of the two circuit boards 1, 4 the retaining sections 14 of the driver board 4 are inserted into the slots 17 of the retainers 16 and are held there by frictional engagement. Preferably, no further mechanical fastening of the driver board 4 on the LE circuit board 1 is necessary.

Figure 5:
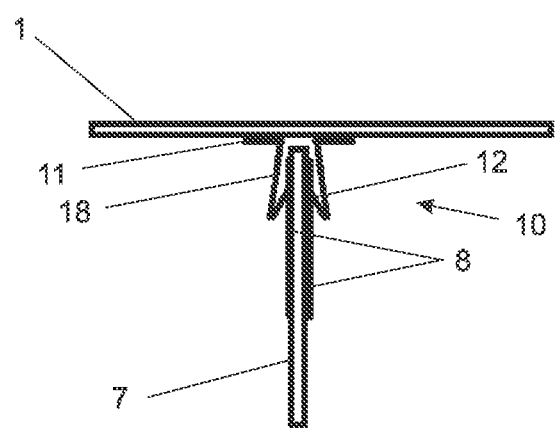
FIG. 5 shows a schematic representation of the connection of two circuit boards.

The connection of two circuit boards according to a further embodiment is illustrated schematically in FIG. 5. In this embodiment the LE circuit board 1 has no opening.

Two contact elements 10 are arranged opposite one another on the underside of the LE circuit board 1 (i.e. on the side facing the driver board), so that between them a spacing remains which substantially corresponds to the thickness of the driver board or of the connecting section 7 of the driver board. In this embodiment the connecting section 7 does not have to be configured as a projection of the driver board, but can transition in a flush manner into the rest of the driver board.

Each contact element 10 consists of a strip of a metal plate (for example CuSn6) which is subdivided in three areas by being bent twice. An edge region constitutes a fastening region 11 by which the contact element 10 is connected to a conductive track, for example by soldering.

A connecting region 18, which encloses an angle of approximately 70° to approximately 80° with the fastening region 11, adjoins the fastening region 11. The angle can also be smaller (for example approximately 45° or 60°) or larger (for example approximately 90° or more). A contact region 12, which encloses an angle of approximately 20° to approximately 30° with the connecting region 18, again adjoins the connecting region 18. The angle can also be smaller (for example approximately 10°) or larger (for example approximately 45° or 60°). The free end of the contact region 12 butts with pressure against the contact area 8 on the respective surface of the connecting section 7. As a result, an electrical connection between the driver board and the LE circuit board 1 is produced.

Figure 6:
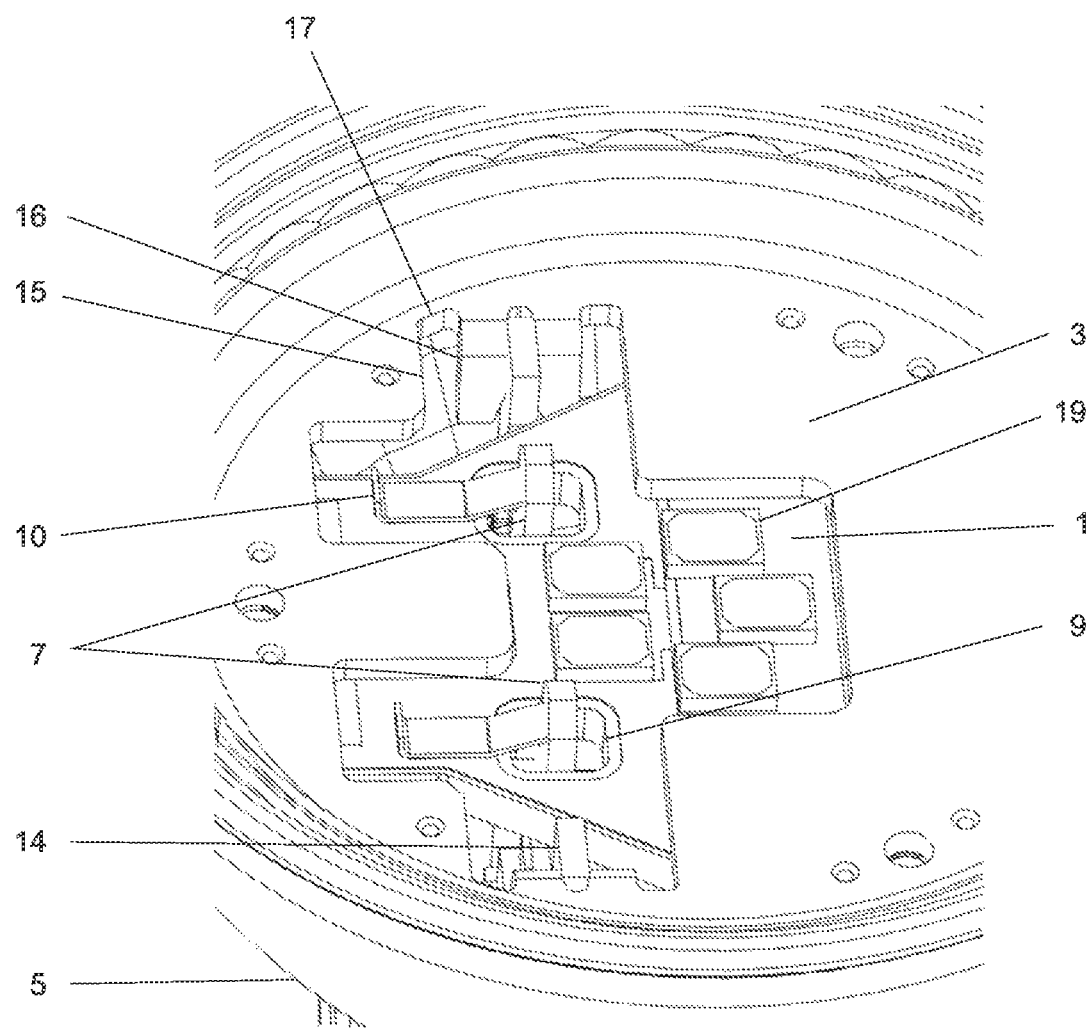
FIG. 6 shows a schematic representation of a further embodiment of a light fixture.

A further embodiment of a light fixture according to the invention is shown schematically in FIG. 6. Features which are identical or similar to the embodiment according to FIGS. 1 and 2 are not explained again here. The light fixture is designed as a LED retrofit lamp in a reflector model (for example in the model MR16 with a base GU10), but other models are also possible. The light fixture has a light engine (LE) which has at least one LE circuit board 1 with five LEDs 19 here. In other embodiments a different number of LEDs is possible. The side of the LE circuit board 1 on which the LEDs 19 are mounted is designated below as the upper side.

The LE circuit board 1 is in thermal contact with a cooling element 3 in order to improve the heat dissipation.

Furthermore, the light fixture has a driver board 4 which is arranged below the LE circuit board 1 in the housing 5 of the light fixture. On its edge facing the LE circuit board 1 the driver board 4 has two connecting sections 7 as well as two retaining sections 14.

Both connecting sections 7 have on one of their two surfaces a contact area 8 in the form of a piece of a conductive track. The two contact areas 8 constitute the driver outputs (for example + and −). Accordingly, they are electrically connected to the driver and provide the energy supply for the LED. The connecting sections 7 extend through two openings 9 in the LE circuit board 1, so that the two contact areas 8 can be contacted by contact elements 10 which are arranged on the upper side of the LE circuit board 1.

On the upper side of the LE circuit board 1 the contact elements 10 are electrically conductively connected to conductive tracks (not shown) and in each case on one side of the openings 9 are arranged adjacent to the surface of the connecting sections 7 on which the contact area 8 is located.

The contact element 10 illustrated schematically in FIG. 4 can be used as contact elements 10.

In this embodiment the driver board can be one-sided, i.e. with conductive tracks only on one side, which may be more favorable in production by comparison with a double-sided driver board.

Although the invention has been illustrated and described in greater detail by the depicted exemplary embodiments, the invention is not restricted thereto and other variations can be deduced therefrom by the person skilled in the art without departing from the scope of protection of the invention. In particular the disclosed type of connection between two circuit boards can also be used in electronic devices other than lighting devices.

In general "a" or "an" may be understood as a single number or a plurality, in particular in the context of "at least one" or "one or more" etc., provided that this is not explicitly precluded, for example by the expression "precisely one" etc.

Also, when a number is given this may encompass precisely the stated number and also a conventional tolerance range, provided that this is not explicitly ruled out.

If applicable, all individual features which are set out in the exemplary embodiments can be combined with one another and/or exchanged for one another, without departing from the scope of the invention.

LIST OF REFERENCES

1 light engine circuit board
2 solder pads
3 cooling element
4 driver board
5 housing
6 connectors
7 connecting section
7a, 7b surfaces of the connecting section
8 contact areas
9 opening
10 contact element
11 fastening region
12 contact region
13 retaining region
14 retaining sections
15 cutout
16 retainer
17 slot
18 connection region
19 LED

The invention claimed is:

1. A lighting device comprising:
   a first circuit board having one or more connecting sections, the one or more connecting sections having overall a plurality of contact areas; and
   a second circuit board having a plurality of contact elements electrically conductively connected to conductive tracks of the second circuit board, wherein each of the plurality of contact elements has a contact region by which said contact element butts against one of the plurality of contact areas of the first circuit board.

2. The lighting device according to claim 1, wherein the first circuit board has only one connecting section having the plurality of contact areas.

3. The lighting device according to claim 1, wherein:
   the second circuit board further has one or more openings; and
   the first circuit board and the second circuit board are arranged so that the one or more connecting sections of the first circuit board extend through the one or more openings of the second circuit board.

4. The lighting device according to claim 1, wherein the plurality of contact areas are arranged on opposite surfaces of the first circuit board.

5. The lighting device according to claim 3, wherein the plurality of contact elements are arranged on opposite sides of the one or more openings.

6. The lighting device according to claim 3, wherein the first circuit board is located substantially on a first side of the second circuit board, and wherein the plurality of contact elements are arranged on a second side of the second circuit board.

7. The lighting device according to claim 1, wherein at least one of the plurality of contact elements is elastic.

8. The lighting device according to claim 1, wherein at least one of the plurality of contact elements applies pressure against at least one of the plurality of contact areas.

9. The lighting device according to claim 1, wherein at least one of the plurality of contact elements has a strip of electrically conductive material.

10. The lighting device according to claim 9, wherein at least one of the plurality of contact elements has a fastening region electrically conductively connecting the at least one of the plurality of contact elements to one of the conductive tracks of the second circuit board.

11. The lighting device according to claim 10, wherein the fastening region and the contact region are arranged relative to one another at an angle greater than 0 degrees.

12. The lighting device according to claim 1, wherein the plurality of contact elements are electrically conductively connected by soldering to the conductive tracks of the second circuit board.

13. The lighting device according to claim 1, wherein at least one of the plurality of contact elements is subdivided into the contact region and a second region by being bent therebetween.

14. The lighting device according to claim 13, wherein the second region is a fastening region electrically conductively connecting the at least one of the plurality of contact elements to one of the conductive tracks of the second circuit board.

15. The lighting device according to claim 1, wherein the first circuit board has only two connecting sections, wherein:
   a first of the two connecting sections has at least one of the plurality of contact areas; and
   a second of the two connecting sections has at least one other of the plurality of contact areas.

16. The lighting device according to claim 15, wherein the second circuit board has only two contact elements, wherein:

a first of the two contact elements butts against the at least one of the plurality of contact areas of the first of the two connecting sections; and a second of the two contact elements butts against the at least one other of the plurality of contact areas of the second of the two connecting sections.

17. The lighting device according to claim 1, wherein at least one of the plurality of contact elements is elastic such that, in butting against one of the plurality of contact areas of the first circuit board, a press fit between said at least one of the plurality of contact elements and said one of the plurality of contact areas is provided.

18. The lighting device according to claim 1, wherein the one or more connecting sections extend through an opening in the second circuit board such that the contact region of each of the plurality of contact elements butts against the one of the plurality of contact areas on a single side of the second circuit board.

19. The lighting device according to claim 1, wherein the plurality of contact elements comprises two separate contact elements which longitudinally extend in opposing directions.

20. The lighting device according to claim 1, wherein the plurality of contact elements comprises two separate contact elements which longitudinally extend parallel to one another in a same direction.

* * * * *